United States Patent
Zhou et al.

(10) Patent No.: US 9,455,743 B2
(45) Date of Patent: Sep. 27, 2016

(54) DEDICATED ARITHMETIC ENCODING INSTRUCTION

(71) Applicant: QUALCOMM Incorporated, San Diego, CA (US)

(72) Inventors: Bo Zhou, San Diego, CA (US); Mao Zeng, Austin, TX (US); Erich James Plondke, Austin, TX (US); Lucian Codrescu, Austin, TX (US); Shu Xiao, San Diego, CA (US); Junchen Du, San Diego, CA (US); Suhail Jalil, Poway, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/288,018

(22) Filed: May 27, 2014

(65) Prior Publication Data

US 2015/0349796 A1    Dec. 3, 2015

(51) Int. Cl.
| | |
|---|---|
| *H03M 7/00* | (2006.01) |
| *H03M 7/40* | (2006.01) |
| *G06F 9/30* | (2006.01) |
| *G06F 9/38* | (2006.01) |
| *H04N 19/91* | (2014.01) |
| *H04N 19/13* | (2014.01) |

(52) U.S. Cl.
CPC ........ *H03M 7/4018* (2013.01); *G06F 9/30018* (2013.01); *G06F 9/30025* (2013.01); *G06F 9/3895* (2013.01); *H04N 19/91* (2014.11); *H04N 19/13* (2014.11)

(58) Field of Classification Search
CPC ........... H03M 7/4018; H03M 7/4012; H03M 7/4043; H04N 7/50; H04N 7/26244; H04N 19/13
USPC ................................ 341/51, 107; 375/240.02
See application file for complete search history.

(56) References Cited

U.S. PATENT DOCUMENTS

| | | | | |
|---|---|---|---|---|
| 7,061,410 | B1 * | 6/2006 | Pearson | H04N 19/40 341/106 |
| 7,561,082 | B2 | 7/2009 | Vaithianathan | |
| 7,839,311 | B2 * | 11/2010 | Bao et al. | 341/107 |
| 7,932,843 | B2 * | 4/2011 | Demircin | H03M 7/4006 341/107 |

(Continued)

FOREIGN PATENT DOCUMENTS

| | | |
|---|---|---|
| WO | 2011063362 A1 | 5/2011 |
| WO | 2013050612 A1 | 4/2013 |

OTHER PUBLICATIONS

ITU—T H.265: "High efficiency video coding" Series H: Audio-visual and Multimedia Systems Infrastructure of audiovisual services—Coding of moving video, International Telecommunication Union, Apr. 2013, pp. 1-300.

(Continued)

*Primary Examiner* — Khai M Nguyen
(74) *Attorney, Agent, or Firm* — Toler Law Group, PC

(57) ABSTRACT

A method includes executing, at a processor, a dedicated arithmetic encoding instruction. The dedicated arithmetic encoding instruction accepts a plurality of inputs including a first range, a first offset, and a first state and produces one or more outputs based on the plurality of inputs. The method also includes storing a second state, realigning the first range to produce a second range, and realigning the first offset to produce a second offset based on the one or more outputs of the dedicated arithmetic encoding instruction.

23 Claims, 7 Drawing Sheets

(56) References Cited

U.S. PATENT DOCUMENTS

| | | | |
|---|---|---|---|
| 7,982,641 B1 | 7/2011 | Su et al. | |
| 8,638,850 B2* | 1/2014 | Frank | 375/240.02 |
| 8,782,379 B2* | 7/2014 | Liu et al. | 712/223 |
| 2004/0240559 A1* | 12/2004 | Prakasam et al. | 375/240.25 |
| 2007/0285286 A1 | 12/2007 | Hussain et al. | |
| 2011/0125987 A1* | 5/2011 | Plondke | H03M 7/4006 712/208 |
| 2012/0299757 A1 | 11/2012 | Xu | |

OTHER PUBLICATIONS

International Search Report and Written Opinion—PCT/US2015/028443—ISA/EPO—Jul. 16, 2015, 12 pages.

Marpe, Detlev et al., "Context-Based Adaptive Binary Arithmetic Coding in the H.264/AVC Video Compression Standard," IEEE Transactions on Circuits and Systems for Video Technology, IEEE Service Center, pp. 620-636, XP011099255, vol. 13 (7), Jul. 2003.

* cited by examiner

DEDICATED ARITHMETIC ENCODING INSTRUCTION

I. FIELD

The present disclosure is generally related to microprocessor instructions.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

To achieve efficient data transfer, a video bitstream representing a video file may be encoded prior to transmission to computing devices such as wireless telephones. Context-based adaptive binary arithmetic coding (CABAC) may be used to serially encode the video file. General purpose instructions may be used during CABAC encoding to encode bins (e.g., bits). However, general purpose instructions may be inefficient due to relatively large processing times.

III. SUMMARY

Apparatuses and methods for encoding video streams are disclosed. Encoding a bit (e.g., a "bin") using a context adaptive binary arithmetic coding (CABAC) encoding scheme includes recursively updating a "range" and an "offset" of a "current" code interval. The range may include a first subinterval (e.g., a least probable symbol (LPS)) and a second subinterval (e.g., a most probable symbol (MPS)). If the bin is encoded as an MPS (e.g., a logical "1"), the range may be equal to a range of the MPS (e.g., rMPS) and the offset, which may be denoted "low," and may remain constant (e.g., $low_{new}$=low). Alternatively, if the bin is encoded as an LPS (e.g., a logical "0"), the range may be equal to a range of the LPS (e.g., rLPS) and the offset may be equal to a sum of the offset and the range of the MPS (e.g., $low_{new}$=low+rMPS). The offset is an encoded bitstream.

In accordance with the described techniques, a dedicated arithmetic encoding instruction, such as a dedicated CABAC instruction, to encode a video stream using CABAC is executable by a processor. The processor may be configured to execute general purpose instructions and to execute the dedicated arithmetic encoding instruction. For example, the dedicated arithmetic encoding instruction accepts as input a first range, a first offset, and a first state. The processor may store a second state, realign the first range to produce a second range, and realign the first offset to produce a second offset based on one or more outputs of the dedicated arithmetic encoding instruction.

For example, during execution of the dedicated arithmetic encoding instruction, the first range (e.g., 9 bits) may be stored in a first register (e.g., a 32-bit register) and the first offset (e.g., 10 bits) may be stored in a second register (e.g., a 32-bit register). The first register may include leading zeros, the first range (e.g., 9 bits), and trailing zeros. A bit position (e.g., "bitpos") may indicate the number of leading zeros in the first register and may be obtained using a count leading zero (CLZ) instruction. Thus, in a particular example, the number of trailing zeros is (32−9−bitpos)=(23−bitpos). Bit(s) may be extracted from the first register and used as an index to find a value of the range of the LPS in a look-up table. The value of the range of the LPS may be left-shifted by the number of trailing zeros to align the value of the range of the LPS with the first range (e.g., 9 bits) in the first register. After each encoding iteration, bins in the first register may be renormalized such that a most significant bit (MSB) of the first range (e.g., 9 bits) used in the next iteration is equal to 1.

During renormalization, particular bytes of the second register may be provided (e.g., outputted) to the bitstream. For example, when the MSB of the range is less than 1 (corresponding to an increase in the offset), the first and second bytes of the second register may be provided to the bitstream, the third byte of the second register may be left-shifted to the first byte position, and the fourth byte of the second register may be cleared to renormalize the second register (e.g., the offset) and the first register (e.g., the range).

Using the dedicated arithmetic encoding instruction (e.g., a single instruction) to encode a bin may increase encoding speed compared to using multiple general purpose instructions. For example, the use of a dedicated arithmetic encoding instruction reduces the time to generate an encoded video stream bit from multiple processor execution cycles (i.e., >2 cycles) (using general purpose instructions) to 2 processor execution cycles.

In a particular aspect, an apparatus includes a memory and a processor coupled to the memory. The processor is configured to execute a dedicated arithmetic encoding instruction. The dedicated arithmetic encoding instruction accepts a plurality of inputs including a first range, a first offset, and a first state and produces one or more outputs based on the plurality of inputs. Based on the one or more outputs of the dedicated arithmetic encoding instruction, the processor is configured to store a second state, realign the first range to produce a second range, and realign the first offset to produce a second offset.

In another particular aspect, a method includes executing, at a processor, a dedicated arithmetic encoding instruction. The dedicated arithmetic encoding instruction accepts a plurality of inputs including a first range, a first offset, and a first state and produces one or more outputs based on the plurality of inputs. The method also includes, based on the one or more outputs of the dedicated arithmetic encoding instruction, storing a second state, realigning the first range to produce a second range, and realigning the first offset to produce a second offset.

In another particular aspect, a non-transitory computer-readable medium includes a dedicated context adaptive binary arithmetic (CABAC) encoding instruction that accepts a plurality of inputs including a first range, a first offset, and a first state and produces one or more outputs based on the plurality of inputs. The dedicated CABAC encoding instruction is executed by a processor. The dedicated CABAC encoding instruction causes the processor to store a second state, realign the first range to produce a second range, and realign the first offset to produce a second offset In another particular aspect, an apparatus includes means for storing general purpose instructions and a dedicated arithmetic encoding instruction. The apparatus also includes means for executing the general purpose instructions retrieved from the means for storing. The apparatus further includes means for executing the dedicated arithmetic encoding instruction retrieved from the means for storing. The dedicated arithmetic encoding instruction accepts a plurality of inputs including a first range, a first offset, and a first state. The dedicated arithmetic encoding instruction is executed to produce one or more outputs based on the plurality of inputs. Based on the one or more outputs, a second state is stored, the first range is realigned to produce a second range, and the first offset is realigned to produce a second offset.

One particular advantage provided by at least one of the disclosed aspects is the ability to program and execute a dedicated arithmetic encoding instruction at a microprocessor. Use of a dedicated arithmetic encoding instructions may reduce the number of processor execution cycles to encode an entropy-encoded video bitstream (e.g., an H.264 CABAC video bitstream or an H.265 CABAC video bitstream). Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
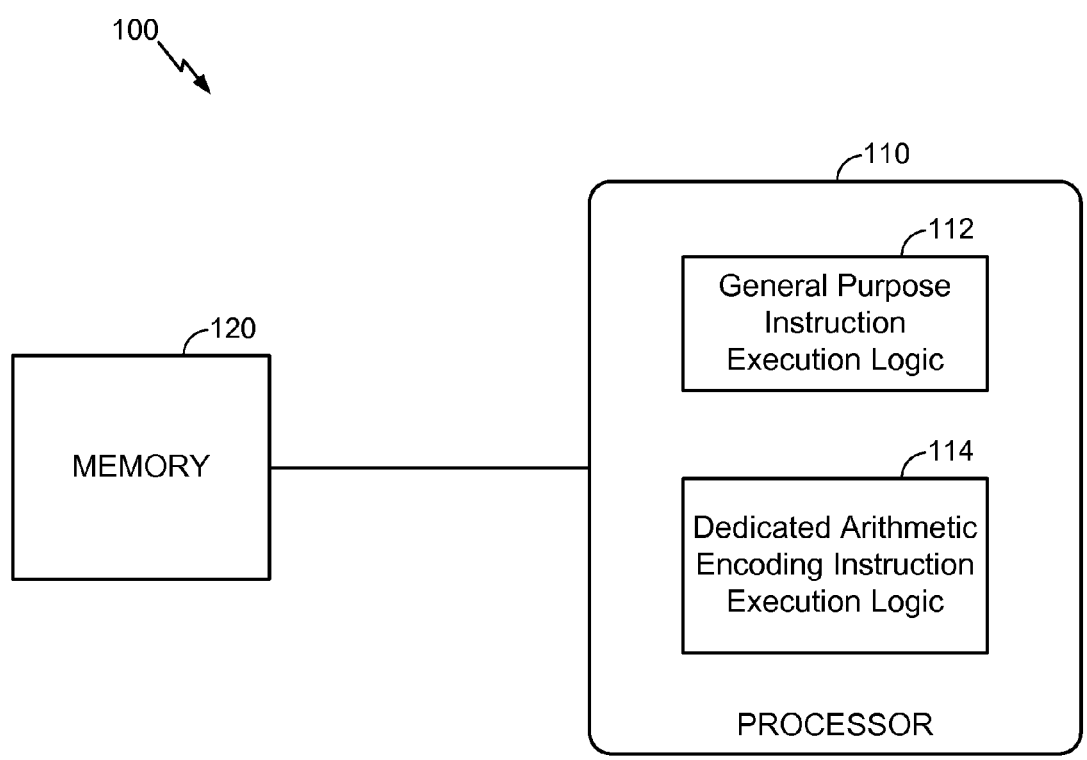
FIG. 1 is a diagram of a particular illustrative aspect of a system that is operable to execute a dedicated arithmetic encoding instruction.

Referring to FIG. 1, a particular illustrative aspect of a system 100 that is operable to execute a dedicated arithmetic encoding instruction is shown. The system 100 includes a processor 110 coupled to a memory 120.

The processor 110 includes general purpose instruction execution logic 112 configured to execute general purpose instructions. General purpose instructions may include commonly executed processor instructions, such as LOAD, STORE, JUMP, ADD, INCREMENT, etc. The general purpose instruction execution logic 112 may include general purpose load-store logic to execute the general purpose instructions. The processor 110 also includes dedicated arithmetic encoding instruction execution logic 114 configured to execute a dedicated arithmetic encoding instruction. The dedicated arithmetic encoding instruction is executable by the processor 110 to encode a video stream based on an entropy coding scheme, such as the context adaptive binary arithmetic coding (CABAC) scheme. In a particular aspect, the dedicated arithmetic encoding instruction may be used in encoding a video stream in accordance with the two-hundred and sixty-fourth audiovisual and multimedia systems standard promulgated by the International Telecommunications Union (H.264, entitled "Advanced video coding for generic audiovisual services"). In another aspect, the dedicated arithmetic encoding instruction may be used in encoding a video stream in accordance with the two-hundred and sixty-fifth audio visual and multimedia systems standard promulgated by the International Telecommunications Union (H.265, entitled "Series H: Audiovisual and Multimedia Systems, Infrastructure of audiovisual services—coding of moving video").

In a particular aspect, the general purpose instructions and the dedicated arithmetic encoding instruction are executed by a common execution unit of the processor 110. For example, the common execution unit may include both the general purpose instruction execution logic 112 and the dedicated arithmetic encoding instruction execution logic 114. In an illustrative aspect, the dedicated arithmetic encoding instruction is an atomic instruction that is executable by the processor 110 without separating the dedicated arithmetic encoding instruction into one or more general purpose instructions to be executed by the general purpose instruction execution logic 112. The dedicated arithmetic encoding instruction may be a single instruction of an instruction set of the processor 110 and may be executed in a small number of cycles (e.g., less than three execution cycles) of the processor 110. In a particular aspect, the processor 110 is a pipelined multi-threaded very long instruction word (VLIW) processor.

The memory 120 may include random access memory (RAM), read only memory (ROM), register memory, or any combination thereof. Although the memory 120 is illustrated in FIG. 1 as being separate from the processor 110, the memory 120 may instead be an embedded memory (e.g., cache) of the processor 110.

In operation, the processor 110 may be used in encoding a video stream. While encoding a particular bit of the video stream, the processor 110 may retrieve a dedicated arithmetic encoding instruction from the memory 120 and the logic 114 may execute the retrieved instruction.

It will be appreciated that the system 100 of FIG. 1 may enable the execution of a dedicated arithmetic encoding instructions (e.g., while encoding video streams). Processors configured to execute dedicated arithmetic encoding instructions (e.g., the processor 110) may encode video streams faster than processors that execute a video encoding algorithm using multiple general purpose instructions. For example, the ability to execute dedicated arithmetic encoding instructions may enable a processor to perform complex and time-consuming encoding operations in fewer execution cycles than by using general purpose instructions, as further described herein.

Figure 2:
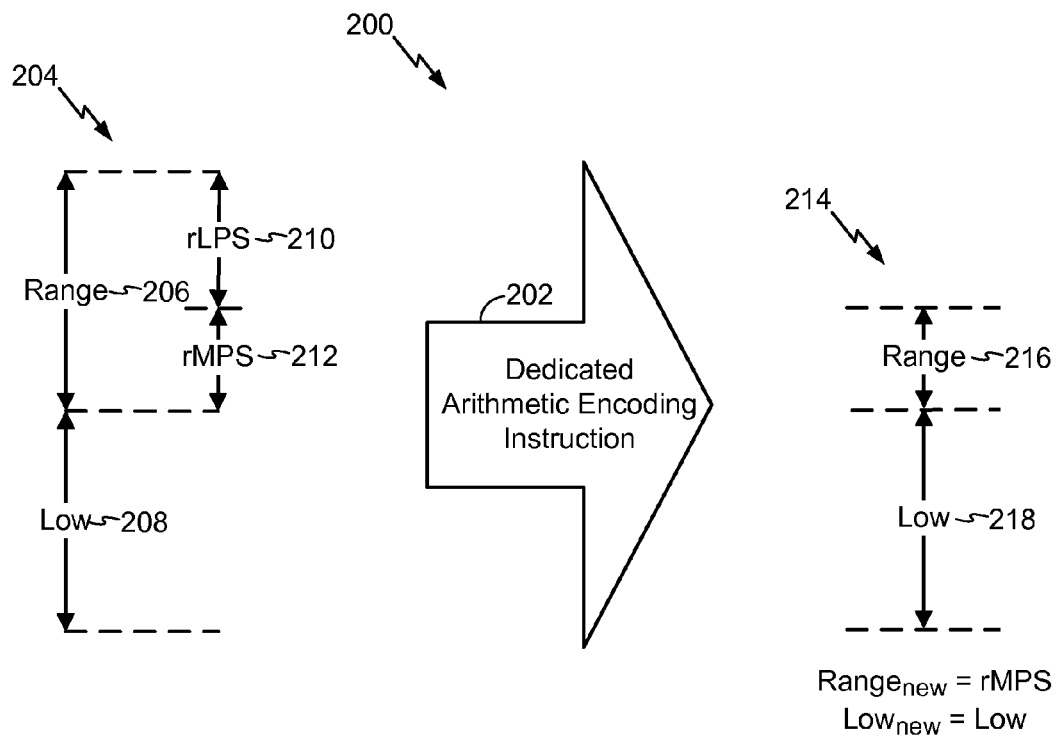
FIG. 2 is an illustrative aspect of modifying CABAC ranges and offsets using a dedicated arithmetic encoding instruction.
Figure 2:
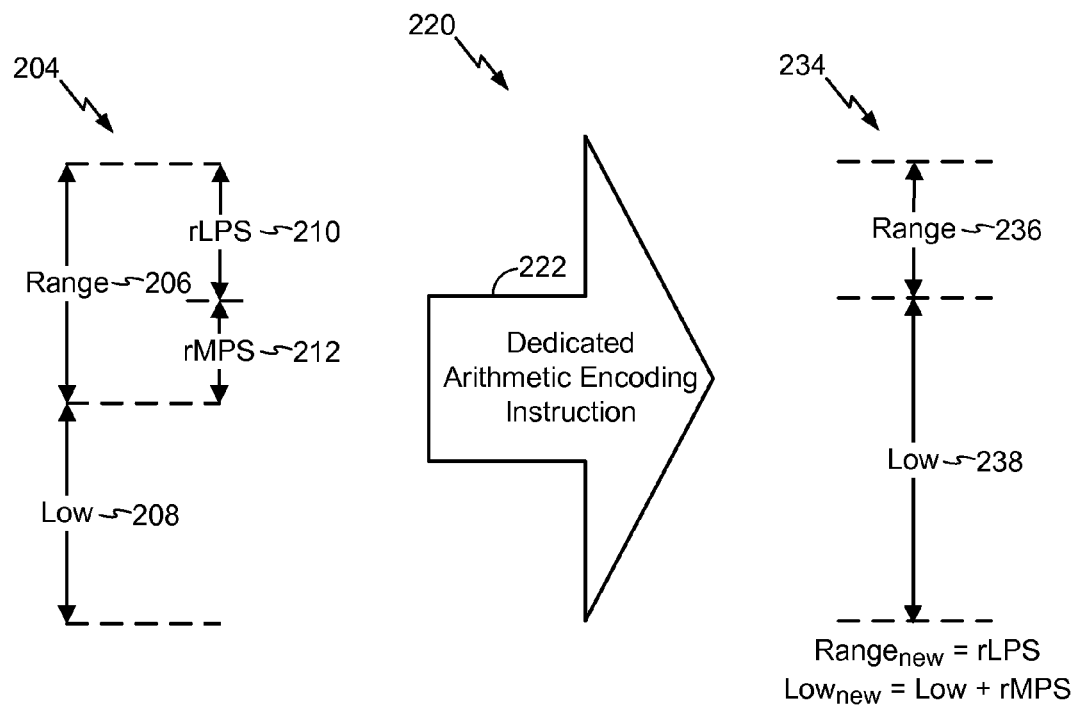

Referring to FIG. 2, illustrative aspects 200, 220 of modifying CABAC ranges and offsets using a dedicated arithmetic encoding instruction is disclosed. CABAC is a form of binary arithmetic coding. Generally, binary arithmetic coding may be characterized by two quantities: a current interval "range" and a current "offset" in the current interval range.

To encode a particular bit, the current range is first subdivided into two portions based on the probability of a least probable symbol (LPS) and a most probable symbol (MPS). For example, the LPS may be a "zero" symbol, the MPS may be a "one" symbol, and the current range may be the range between zero and one. Generally, if R is the width of the current range, rLPS is the width of the first portion, rMPS is the width of the second portion, pLPS is the probability of encountering the least probable symbol, and pMPS is the probability of encountering the most probable symbol, then rLPS=RxpLPS and rMPS=RxpMPS=R−rLPS. Thus, when the probability pLPS of the least probable symbol is higher than the probability pMPS of the most probable symbol, the portion corresponding to the least probable symbol will have a larger width rLPS than the width rMPS of the portion corresponding to the most probable symbol. That is, when pLPS>pMPS, rLPS>rMPS. Similarly, when pMPS>pLPS, rMPS>rLPS. Each bin may be encoded as an MPS or an LPS, and the rLPS and rMPS may be iteratively updated based on the encoded bin, as explained below.

For example, as illustrated in the first aspect 200 of FIG. 2, a dedicated arithmetic encoding instruction 202 may be executed to encode a bin 204 as an MPS (e.g., encode the bin as a logical "1"). In a particular aspect, the dedicated arithmetic encoding instruction 202 may be executed by the dedicated arithmetic encoding instruction execution logic 114 of the processor 110 of FIG. 1. A range 206 and a low 208 (e.g., an offset) may characterize the bin 204. The range 206 may be equal to the sum of an rLPS 210 of the bin 204 and an rMPS 212 of the bin 204, as shown. Executing the dedicated arithmetic encoding instruction 202 to encode the bin 204 as the MPS generates an encoded bin 214. A range 216 of the encoded bin 214 equals the rMPS 212 of the bin 204, and a low 218 (e.g., offset) of the encoded bin 214 equals the low 208 of the bin 204.

As another example, as illustrated in the second aspect 220 of FIG. 2, a dedicated arithmetic encoding instruction 222 may be executed to encode the bin 204 as an LPS (e.g., encode the bin as a logical "0"). In a particular aspect, the dedicated arithmetic encoding instruction 222 may be executed by the dedicated arithmetic encoding instruction execution logic 114 of the processor 110 of FIG. 1. Executing the dedicated arithmetic encoding instruction 222 to encode the bin 204 as the LPS may generate an encoded bin 234. A range 236 of the encoded bin 234 equals the rLPS 210 of the bin 204, and a low (e.g., offset) of the encoded bin 234 equals the sum of the low 208 of the bin 204 and the rMPS 212 of the bin 204. In a particular aspect, the dedicated arithmetic encoding instruction 202 and the dedicated arithmetic encoding instruction 222 may be the same instruction.

With reference to the aspects 200, 220 depicted in FIG. 2, the offset (e.g., the low 218, 238, respectively) may be written to the bitstream (an encoded bin). As illustrated in FIG. 2, the range 216, 236 of the encoded bin 214, 234 may be smaller than the range 206 of the bin 204 (e.g., the range may decrease with each encoding step). Thus, the range and the low may be renormalized after encoding each bin or when a value of the range falls below a threshold. For example, a range represented by a 9-bit binary number may be renormalized when a most significant bit (MSB) of the range is less than one (e.g., the MSB=0). Renormalization is described in greater detail with respect to FIG. 5.

CABAC encoding in accordance with H.264 or H.265 is a state-dependent operation. That is, encoding the video stream may include maintaining information (e.g., state, bit position, and MPS bit) other than the range and offset. For H.264 or H.265, the range is a 9-bit quantity and the offset is an at least 9-bit quantity. The calculation of rLPS may be approximated by a 64×4 lookup table of 256 bytes that stores CABAC constants and that is indexed by range and state. Because the values in the lookup table are constants defined by the H.264 standard or the H.265 standard, the lookup table may be hard-coded. Alternatively, the lookup table may be programmable (e.g., rewriteable).

A dedicated CABAC encoding instruction (e.g., the dedicated arithmetic encoding instruction 202, 222) may realign the range, realign the offset, and lookup CABAC constants as described herein. The dedicated CABAC encoding instruction may accept as input CABAC state bits, a CABAC MPS bit, bit position (bitpos) bits, nine CABAC range bits, at least nine CABAC offset bits, and an input value bit (e.g., input value bin). The dedicated CABAC encoding instruction may generate an output including new CABAC state bits, a new CABAC MPS bit, nine CABAC range bits, and at least nine CABAC offset bits. As explained above, the encoding process may be renormalized after certain iterations so that the value of the MSB of the MPS is 1. For example, a dedicated CABAC encoding instruction may operate in accordance with the following pseudo-code:

```
state=Rtt.w[0][5:0];
valMPS=Rtt.w[0][8:8];
bitpos=Rtt.w[1][4:0];
range=Rss.w[0];
low=Rss.w[1];
bin=Pu[0];
range <<=bitpos
range &=0xFF800000U;
rLPS=rLPS_table_64x4[state][(range>>29)&3];
rLPS=rLPS<<23;
rMPS=range-rLPS;
if (bin==valMPS) {
    Rdd=AC_next_state_MPS_64[state];//(state<62)?(state+
      1):state;
    Rdd[8:8]=valMPS;
    Rdd[31:23]=rMPS>>23;
    Rdd.w[1]=low;
} else {
    Rdd=AC_next_state_LPS_64[state];
    Rdd[8:8]=!state?(1-valMPS):valMPS;
    Rdd[31:23]=rLPS>>23;
    Rdd.w[1]=low+(rMPS>>bitpos);
}
```

It should be noted that although many of the equations and expressions as set forth herein use a syntax similar to the C or C++ programming language, the expressions are for illustrative purposes and may instead be expressed in other programming languages with different syntax.

The above pseudo-code may be encapsulated into a function ENCBIN( ) (illustrated below) and an encoded H.264 or H.265 video bit may be generated in two processor cycles.

```
cabac_encode_bin:
{
    R1:0 = ENCBIN(R1:0,R3:2,P0)    //[encode one bin]
                                    //[R0[5:0]: state]
                                    //[R0[8]: valMPS]
                                    //[R0[31:23]: range]
```

```
        R6 = ASL(R5,R2)              //[R1: low]
                                     //[0x100<<bitpos]
    }
    {
        MEMH(R4+#0) = R0             //[store context]
        P1 = CMP.GTU(R6,R0)          //[0x100>range?]
        R0 = LSR(R0,R2)              //[re-align range]
        IF (!P1.NEW) JUMPR:T LR      //[return]
    }
```

In a particular aspect, the use of a dedicated CABAC encoding instruction reduces the time to generate an encoded video stream bit from multiple processor execution cycles (i.e., >2 cycles) (using general purpose instructions) to 2 processor execution cycles.

Figure 3:
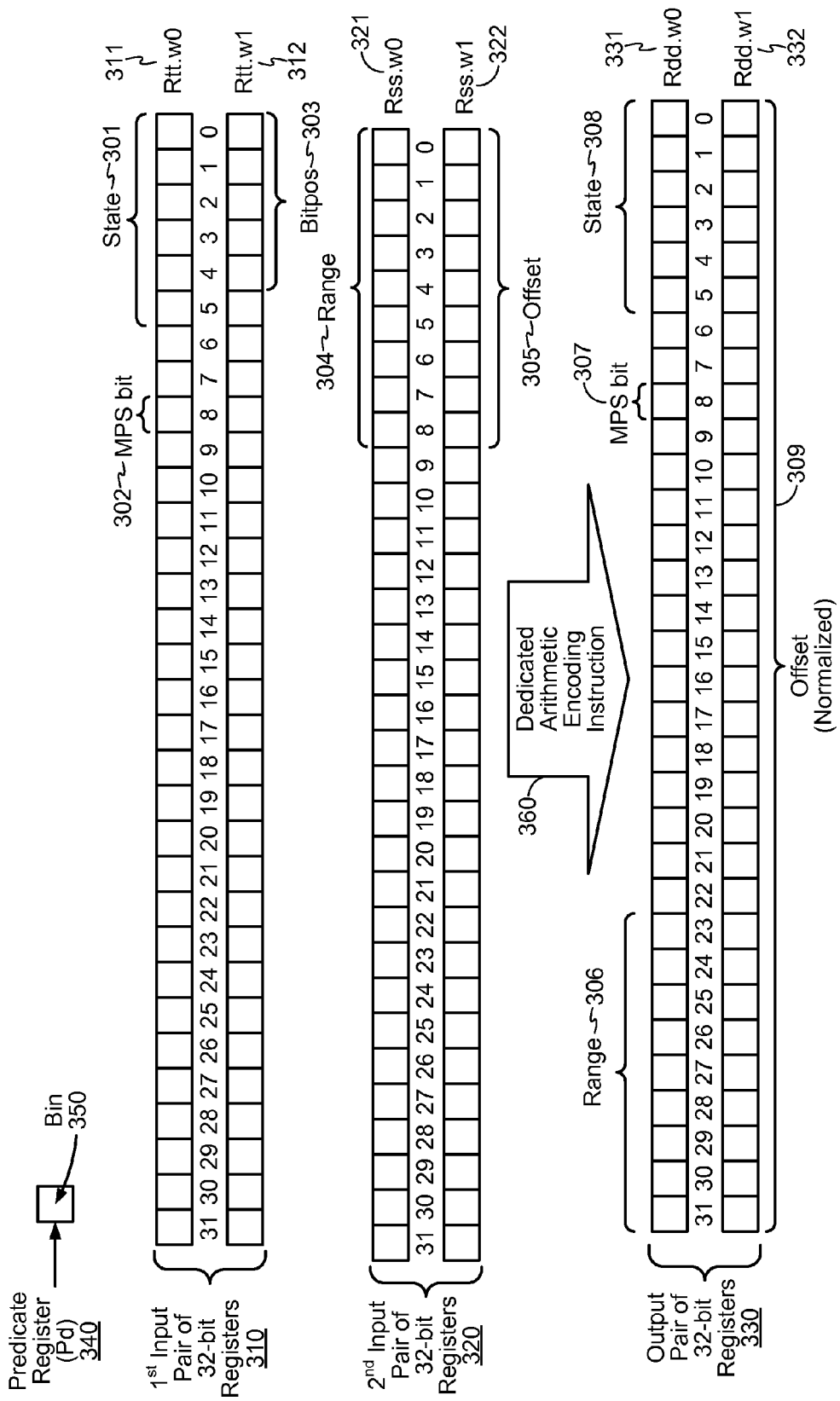
FIG. 3 is a diagram of a particular illustrative aspect of a method of storing information in registers of a processor configured to execute a dedicated arithmetic encoding instruction.

Referring to FIG. 3, a diagram of a particular illustrative aspect of a method of storing information in registers of a processor configured to execute a dedicated arithmetic encoding instruction 360 is disclosed. In an illustrative aspect, the dedicated arithmetic encoding instruction 360 is an H.264 CABAC encoding instruction. In another illustrative aspect, the dedicated arithmetic encoding instruction 360 is an H.265 CABAC encoding instruction. In a particular aspect, the dedicated arithmetic encoding instruction 360 may correspond to one of the dedicated arithmetic encoding instructions 202, 222 of FIG. 2.

During execution of the dedicated arithmetic encoding instruction 360, a bin 350 (e.g., an input value bit 350 of the dedicated CABAC encoding instruction 360) may be stored in a predicate register 340. The bin 350 stored in the predicate register 340 may be used in a decision or a video encoding algorithm. The processor 110 may load and store the data used to execute the dedicated arithmetic encoding instruction 360 in two input register pairs 310 and 320. In a particular aspect, the register pairs 310 and 320 are pairs of 32-bit registers.

A processor may store data generated during execution of the dedicated arithmetic encoding instruction in an output register pair 330. In a particular aspect, the output register pair 330 is a pair of 32-bit registers.

A first register Rtt.w0 311 of the first input register pair 310 may store an input state 301 and an input MPS bit 302. In a particular aspect, bits zero to five of Rtt.w0 311, denoted Rtt.w0[0:5], store the input state 301 and Rtt.w0[8] stores the input MPS bit 302. A second register Rtt.w1 312 of the first input register pair 310 may store an input bitpos 303. For example, Rtt.w1[0:4] may store the input bitpos 303.

A first register Rss.w0 321 of the second input register pair 320 may store an input range 304. For example, Rss.w0[0:8] may store the nine bits of the input range 304. A second register Rss.w1 322 of the second input register pair 320 may store an input offset 305. In a particular aspect, Rss.w1[0:8] stores the nine bits of the input offset 305.

A first register Rdd.w0 331 of the output register pair 330 may store an output state 308, an output MPS bit 307, and an output range 306. For example, Rdd.w0[0:5] may store the 6-bit output state 308, Rdd.w0[8] may store the output MPS bit 307, and Rdd.w0[23:31] may store the output range 306. A second register Rdd.w1 332 of the output register pair 331 may store an output offset 309 in a normalized fashion.

It will be appreciated that a processor may "pack" the output data for a dedicated CABAC encoding instruction into two input register pairs. It should be noted that although the dedicated CABAC encoding instruction 360 has been explained herein with reference to the H.264 video compression standard and/or the H.265 video compression standard, the dedicated CABAC encoding instruction 360 may be used in encoding other arithmetically coded bitstreams. For example, the dedicated CABAC encoding instruction 360 may be used in encoding bitstreams encoded in accordance with the Joint Photographic Experts Group 3000 (JPEG3000) image compression standard. It should be noted that although FIG. 3 illustrates a predicate register, two input register pairs, and one output register pair, the dedicated CABAC encoding instruction 360 may alternately be performed using any number and combination of input and output registers. It should further be noted that although the dedicated CABAC encoding instruction 360 as described herein utilizes a 9-bit range and a 9-bit offset, such bit lengths are for illustrative purposes only. Other arithmetic encoding algorithms may use other bit lengths, and dedicated arithmetic encoding instructions as described herein may accept as input and generate as output data of any bit length.

Figure 4:
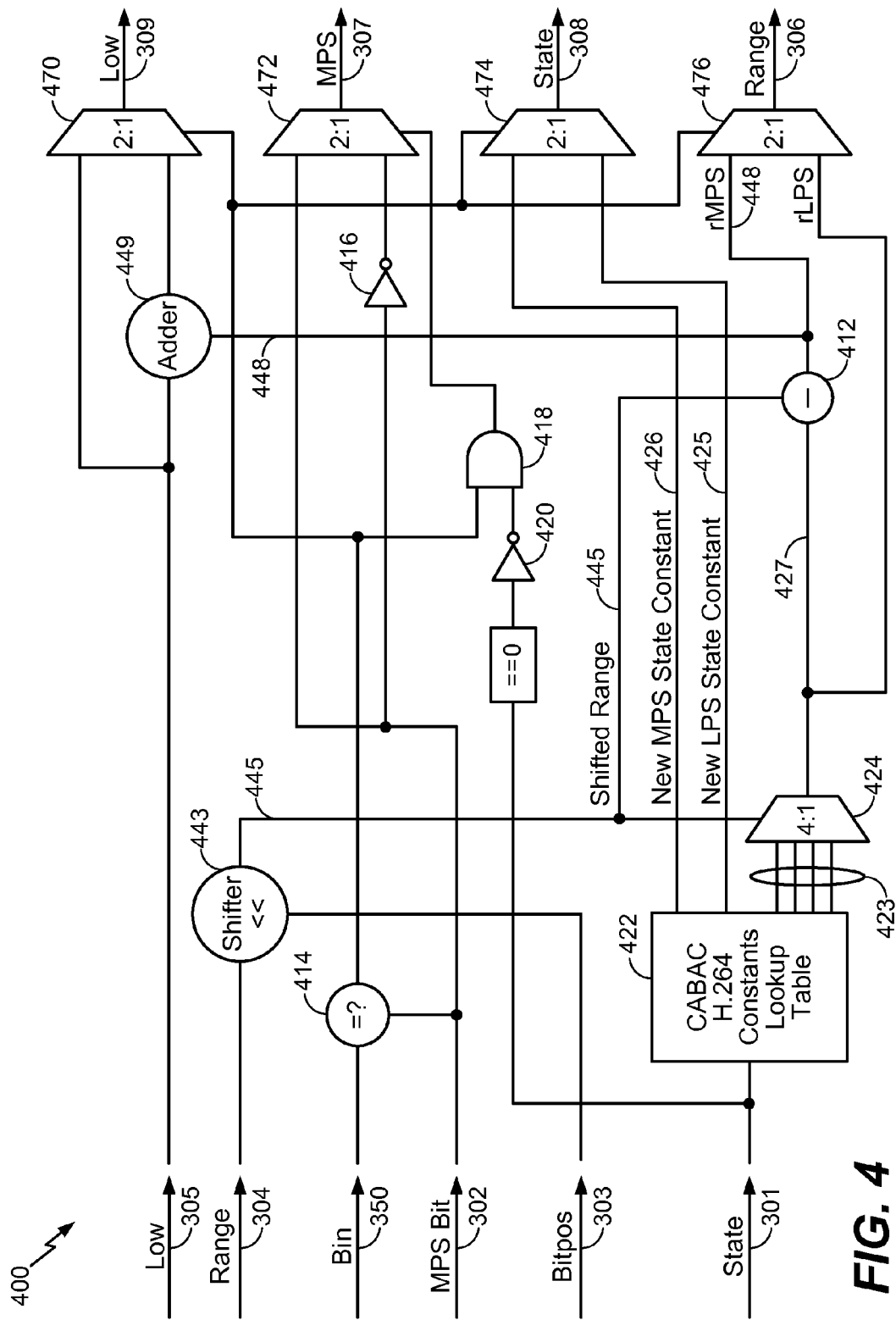
FIG. 4 is an architectural diagram of a particular illustrative aspect of logic to execute a dedicated arithmetic encoding instruction.

Referring to FIG. 4, an architectural diagram of a particular illustrative aspect of logic 400 to execute a dedicated arithmetic encoding instruction is shown. In an illustrative aspect, the dedicated arithmetic encoding instruction is an H.264 CABAC encoding instruction. In another illustrative aspect, the dedicated arithmetic encoding instruction is an H.265 CABAC encoding instruction.

Six input variables may be retrieved and provided to the logic 400. For example, the input state 301 may be retrieved from the first register Rtt.w0 311 of the first input register pair 310, the input MPS bit 302 may be retrieved from the first register Rtt.w0 311 of the first input register pair 310, the input bitpos 303 may be retrieved from the second register Rtt.w1 312 of the first input register pair 310, the input range 304 may be retrieved from the first register Rss.w0 321 of the second input register pair 320, the input offset 305 (e.g., low) may be retrieved from the second register Rss.w1 322 of the second input register pair 320, and the input bin 350 may be retrieved from the predicate register 340.

The input bitpos 303 and the input range 304 may be provided to a left shifter 443. The left shifter 443 may be configured to shift the input range 304 by the input bitpos 303. Shifting the input range 304 by the input bitpos 303 may generate a shifted range 445. The input state 301 is used as an index into a CABAC H.264/H.265 constants lookup table 422. Four CABAC constants 423 are produced as a result of the index operation and input into a 4-to-1 multiplexer 424 that outputs a selected CABAC constant based on the shifted range 445. The selected CABAC constant may correspond to a width of the LPS (e.g., rLPS 427). The shifted range 445 and the rLPS 427 may be provided to a subtractor 412. The subtractor 412 may subtract the rLPS 427 from the shifted range 445 (e.g., Range−rLPS) to generate a width of the MPS (e.g., rMPS 448).

The CABAC H.264/H.265 constants lookup table 422 may also produce a new LPS state constant 425 and a new MPS state constant 426. The new LPS state constant 425 and the new MPS state constant 426 may be provided to a 2-to-1 multiplexer 474. The input bin 350 and the input MPS bit 302 may be provided to a comparator 414. The comparator 414 may determine whether the input bin 350 and the input MPS bit 302 are equal. In response to a determination that the input bin 350 and the input MPS bit 302 are equal, the comparator 414 generates a logical high voltage signal (e.g., a logical "1"). In response to a determination that the input bin 350 and the input MPS bit 302 are not equal, the comparator 414 generates a logical low voltage signal (e.g., a logical "0"). The output of the comparator 414 is provided to a logic-AND gate 418, to a control input of a 2-to-1 multiplexer 470, to a control input of the 2-to-1 multiplexer 474, and to the control input of a 2-to-1 multiplexer 476.

The input offset 305 ("Low") may be provided to the 2-to-1 multiplexer 470 and to an adder 449. The rMPS 448 may also be provided to the adder 449. The adder 449 is configured to add the rMPS 448 with the input offset 305 and to provide the result (e.g., sum) to the 2-to-1 multiplexer 470. Based on the output of the comparator 414, the 2-to-1 multiplexer 470 may output the input offset 305 as the output offset 309 or output the sum of the input offset 305 and rMPS 448 as the output offset 309. For example, when the input bin 350 is encoded as an LPS (e.g., the input bin 350 is not equal to the input MPS bit 302), the comparator 414 may provide a logical high voltage signal to the control input of the 2-to-1 multiplexer 470. In response to receiving the logical high voltage signal, the 2-to-1 multiplexer 470 may output the sum of the input offset 305 and rMPS 448 as the output offset 309 as the output offset 309. When the input bin 350 is encoded as an MPS (e.g., the input bin 350 is equal to the input MPS bit 302), the comparator 414 may provide a logical low voltage signal to the control input of the 2-to-1 multiplexer 470. In response to receiving the logical low voltage signal, the 2-to-1 multiplexer 470 may output the input offset 305 as the output offset 309.

The output state 308 may be dependent on the output of the comparator 414. For example, when the input bin 350 is encoded as an LPS (e.g., the input bin 350 is not equal to the input MPS bit 302), the comparator 414 may provide the logical high voltage signal to the control input of the 2-to-1 multiplexer 474. In response to receiving the logical high voltage signal, the 2-to-1 multiplexer 474 may output the new LPS state constant 425 as the output state 308. When the input bin 350 is encoded as an MPS (e.g., the input bin 350 is equal to the input MPS bit 302), the comparator 414 may provide the logical low voltage signal to the control input of the 2-to-1 multiplexer 474. In response to receiving the logical low voltage signal, the 2-to-1 multiplexer 474 may output the new MPS state constant 426 as the output state 308.

The output range 306 may be dependent on the output of the comparator 414. For example, when the input bin 350 is encoded as an LPS (e.g., the input bin 350 is not equal to the input MPS bit 302), the comparator 414 may provide the logical high voltage signal to the control input of the 2-to-1 multiplexer 476. In response to receiving the logical high voltage signal, the 2-to-1 multiplexer 476 may output rLPS 427 as the output range 306. When the input bin 350 is encoded as an MPS (e.g., the input bin 350 is equal to the input MPS bit 302), the comparator 414 may provide a logical low voltage signal to the control input of the 2-to-1 multiplexer 476. In response to receiving the logical low voltage signal, the 2-to-1 multiplexer 476 may output rMPS 448 as the output range 306.

The input state 301 may also be provided to an inverter 420. The inverter 420 may be configured to invert the input state 301 and provide the result to the logical-AND gate 418. When the output of the comparator 414 and the output of the inverter 420 correspond to logical high voltage signals (e.g., when the input bin 350 equals the input MPS bit 302 and the input state 301 is a logical "0"), the logical-AND gate 418 may provide a logical high voltage signal to the control input of the 2-to-1 multiplexer 472. The input state 301 illustrated in FIG. 4 is a logical "0" (e.g., "==0"). However, the input state 301 may also be a logical "1" (e.g., "==1"). If the input bin 350 does not equal the input MPS bit and/or if the input state 301 is a logical "1," the logical-AND gate 418 may provide a logical low voltage signal to the control input of the 2-to-1 multiplexer 472.

The input MPS bit 302 may be provided to the 2-to-1 multiplexer 472. The input MPS bit 302 may also be inverted by an inverter 416. The output of the inverter (e.g., the inverted input MPS bit) may be provided to the 2-to-1 multiplexer 472. The output MPS bit 307 may be dependent on the output of the logical-AND gate 418. For example, when the logical-AND gate 418 provides the logical high voltage signal to the control input of the 2-to-1 multiplexer 472 (e.g., when the input bin 350 equals the input MPS bit 302 and the input state 301 is a logical "0"), the 2-to-1 multiplexer 472 outputs the inverted input MPS bit as the output MPS bit 302. Otherwise, the 2-to-1 multiplexer 472 outputs the input MPS bit 302 as the output MPS bit 307.

It will be appreciated that because many processors include a shifter, the logic 400 of FIG. 4 may be implemented in such processors by storing the constants lookup table 422 and adding a few circuit elements, such as comparators, adders, inverters, and multiplexers. Thus, a processor may be configured to execute a dedicated arithmetic encoding instruction by implementing the logic 400 of FIG. 4 without requiring substantial changes to the processor.

Figure 5:
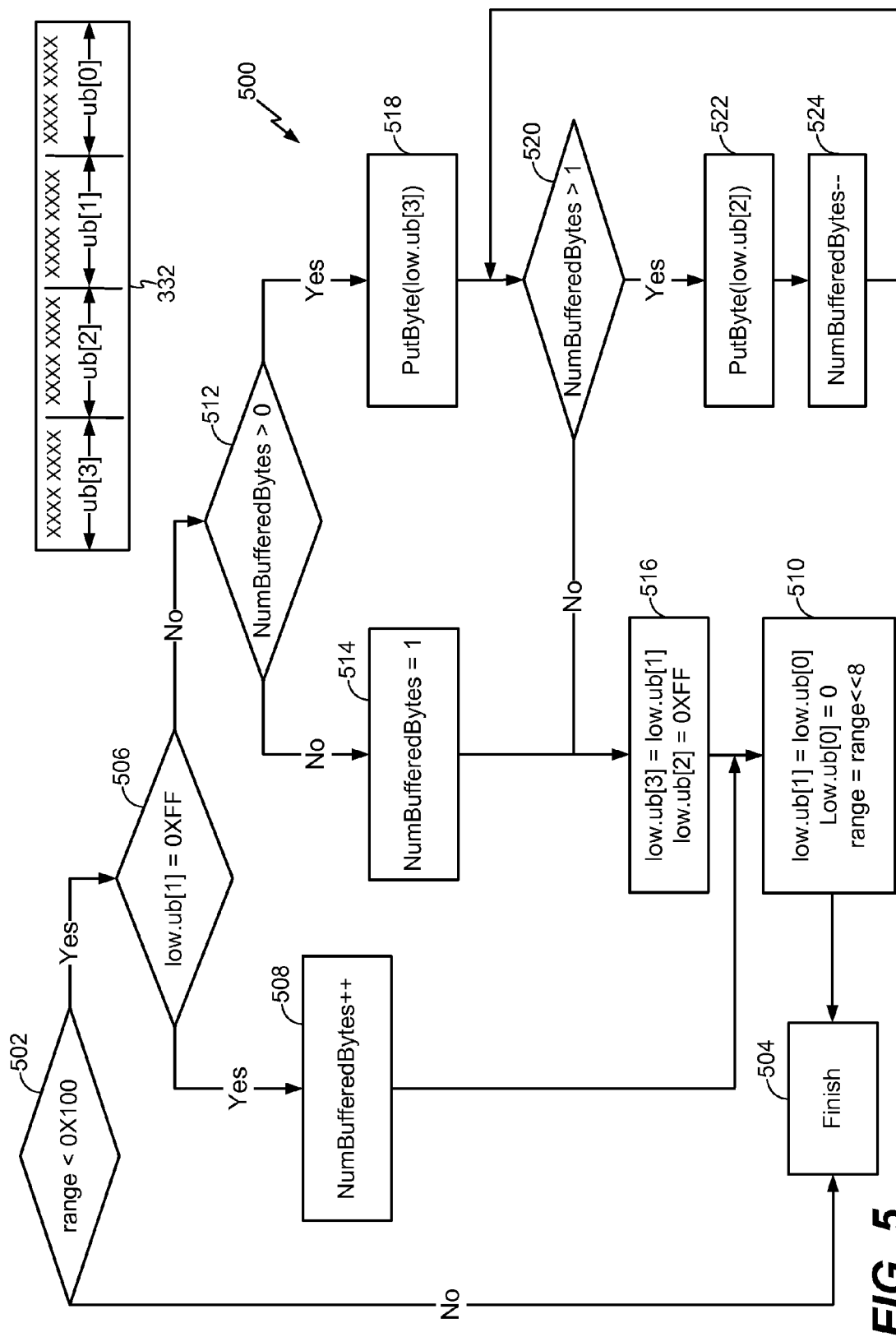
FIG. 5 is a flow diagram that illustrates a method of renormalizing a range and an offset.

Referring to FIG. 5, a flow diagram 500 illustrates a method of renormalizing a range and an offset. The offset may correspond to bits in the second register Rdd.w1 332 of the output register pair 331. For example, the second register Rdd.w1 332 may store eight bits (e.g., a first byte low.ub[0]) in a first portion ub[0], store a second byte low.ub[1] in a second portion ub[1], store a third byte low.ub[2] in a third portion ub[2], and store a fourth byte low.ub[3] in a fourth portion ub[3]. The bytes stored in the second register Rdd.w1 332 may correspond to the output offset 309.

As explained with respect to FIG. 2, the range and the offset may be renormalized when a value of the range falls below a threshold. For example, a range represented by a 9-bit binary number may be renormalized when a most significant bit (MSB) of the range is zero (e.g., the range is less than binary "100000000"). Referring to FIG. 5, a processor (e.g., the processor 110 of FIG. 1) may determine whether the output range 306 is less than hexadecimal value 0x100 (e.g., less than 256), at 502. If the output range 306 is not less than hexadecimal value 0x100, the output offset 309 and the output range 309 do not need to be renormalized and the process ends, at 504.

If the output range 306 is less than hexadecimal value 0x100, the processor may determine whether the second byte low.ub[1] stored in the second portion ub[1] of the third register Rdd.w1 332 is equal to hexadecimal value 0xFF (e.g., 255), at 506. For example, the processor may determine whether each bit of the second byte low.ub[1] is a logical "1" bit. In response to a determination that the second byte low.ub[1] is equal to hexadecimal value 0xFF, the number of buffered bytes (e.g., bytes to be written to an output bitstream) may be incremented, at 508. The processor may then shift the first byte low.ub[0] into the second portion ub[1], load hexadecimal value 0x00 into the first portion ub[0], and shift the output range 306 to the left by eight bits, at 510. The method may end, at 504.

In response to a determination, at 506, that the second byte low.ub[1] is not equal to hexadecimal value 0xFF, the processor may determine whether the number of buffered bytes is greater than zero, at 512. In response to a determination that the number of buffered bytes is greater than zero, the processor may input the fourth byte low.ub[3] into the bitstream, at 518. For example, the processor may transmit the fourth byte low.ub[3] to a decoder as an encoded bitstream. The processor may determine whether the number of buffered bytes is greater than one, at 520. In response to a determination that the number of buffered bytes is greater than one, the processor may input the third byte low.ub[2] into the bitstream, at 522, and may decrement the number of buffered bytes, at 524. The operations at 520-524 may be continued while the number of buffered bytes is greater than one. In response to a determination that the number of buffered bytes is not greater than one, at 520, the processor may shift the second byte low.ub[1] into the fourth portion ub[3] and shift hexadecimal value 0xFF into the third portion ub[2], at 516. Then, the processor may shift the first byte low.ub[0] into the second portion ub[1], load hexadecimal value 0x00 into the first portion ub[0], and shift the output range 306 to the left by eight bits, at 510. After this, the method may end, at 504.

In response to a determination, at 512, that the number of buffered bytes is not greater than zero, the processor may set the number of buffered bytes to one, at 514. Next, the processor may shift the second byte low.ub[1] into the fourth portion ub[3] and shift hexadecimal value 0xFF into the third portion ub[2], at 516. Then, the processor may shift the first byte low.ub[0] into the second portion ub[1], load hexadecimal value 0x00 into the first portion ub[0], and shift the output range 306 to the left by eight bits (e.g., one byte), at 510. The method may end, at 504.

The flow diagram 500 of FIG. 5 may avoid the need to check the carrier bit of the output offset 309 and the need to derive whether a logical "0" or a logical "1" should be written to the bitstream. For example, if there is any carrier that is generated when updating the output offset 309 during execution of the dedicated arithmetic encoding instruction 360, the carrier may be automatically propagated to the fourth byte low.ub[3] (e.g., the most significant byte) via the third byte low.ub[2]. The flow diagram 500 may also reduce a recurrence rate of renormalization by selectively inputting (e.g., writing) multiple bytes to the bitstream based on a number of buffered bytes.

Figure 6:
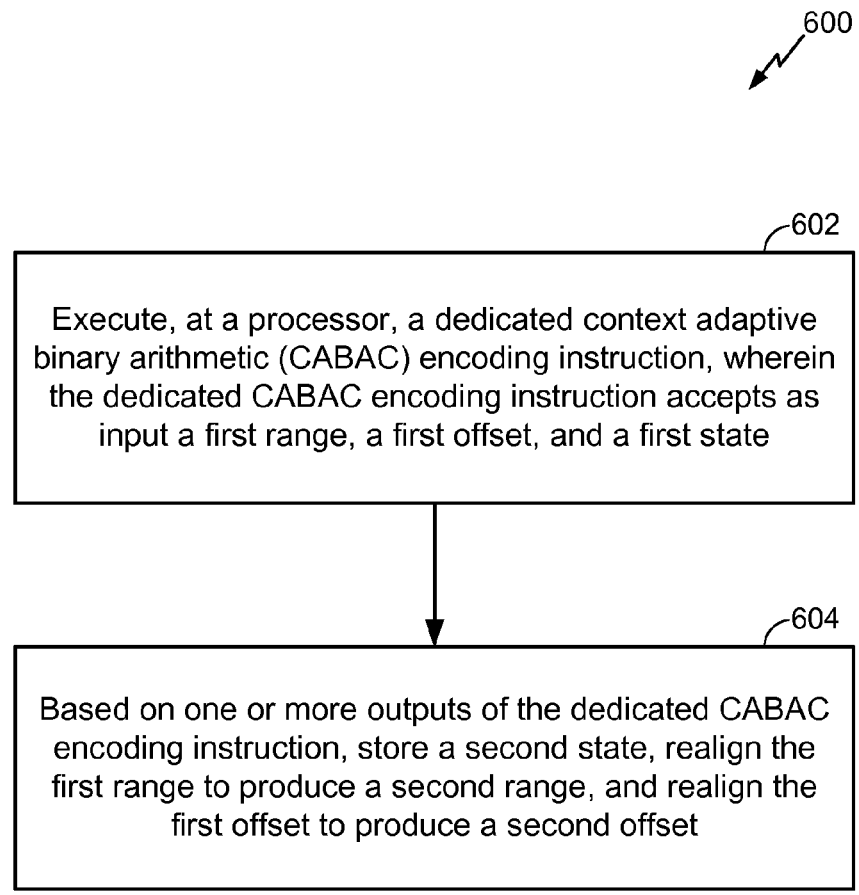
FIG. 6 is a flowchart of a particular illustrative aspect of a method to execute a dedicated arithmetic encoding instruction.

Referring to FIG. 6, a flowchart of a particular illustrative aspect of a method 600 of executing a dedicated arithmetic encoding instruction is shown. In an illustrative aspect, the method 600 may be performed by the processor 110 of FIG. 1 or the logic 400 of FIG. 4.

The method 600 includes executing, at a processor, a dedicated context adaptive binary arithmetic (CABAC) encoding instructing, at 602. For example, the processor 110 may execute one or more dedicated arithmetic encoding instructions, such as the dedicated arithmetic encoding instruction 202, 222 or the dedicated arithmetic encoding instruction 360. The dedicated arithmetic encoding instructions 202, 222, 360 may accept as input the input state 301 (e.g., a first stage), the input MPS bit 302, the input bit position (bitpos) 303, the input range 304 (e.g., a first range), the input offset 305 (e.g., a first offset), and the input bin 350.

The method 600 may also include, based on one or more outputs of the dedicated CABAC encoding instruction, storing a second state, realigning the first range to produce a second range, and realigning the first offset to produce a second offset, at 604. For example, executing the dedicated arithmetic encoding instruction may generate the output offset 309 (e.g., the second offset), the output MPS bit 307, the output state 308 (e.g., the second state), and the output range 306 (e.g., the second range). Referring to FIG. 3, the output MPS bit 307 may be stored in first register Rdd.w0 331 of the output register pair 330, the input range 304 in the first register Rss.w0 321 of the second input register pair 320 may be realigned in the first register Rdd.w0 331 of the output register pair 330, and the input offset 305 in the second register Rss.w1 322 of the second input register pair 320 may be realigned in the second register Rdd.w1 332 of the output register pair 330.

The method 600 of FIG. 6 may enable the execution of dedicated arithmetic encoding instructions (e.g., while encoding video streams). Processors configured to execute dedicated arithmetic encoding instructions (e.g., the processor 110) may encode video streams faster than processors that execute a video encoding algorithm (e.g., CABAC) using multiple general purpose instructions. For example, the ability to execute a dedicated arithmetic encoding instruction may enable a processor to perform complex and time-consuming encoding operations in fewer execution cycles than by using general purpose instructions.

Figure 7:
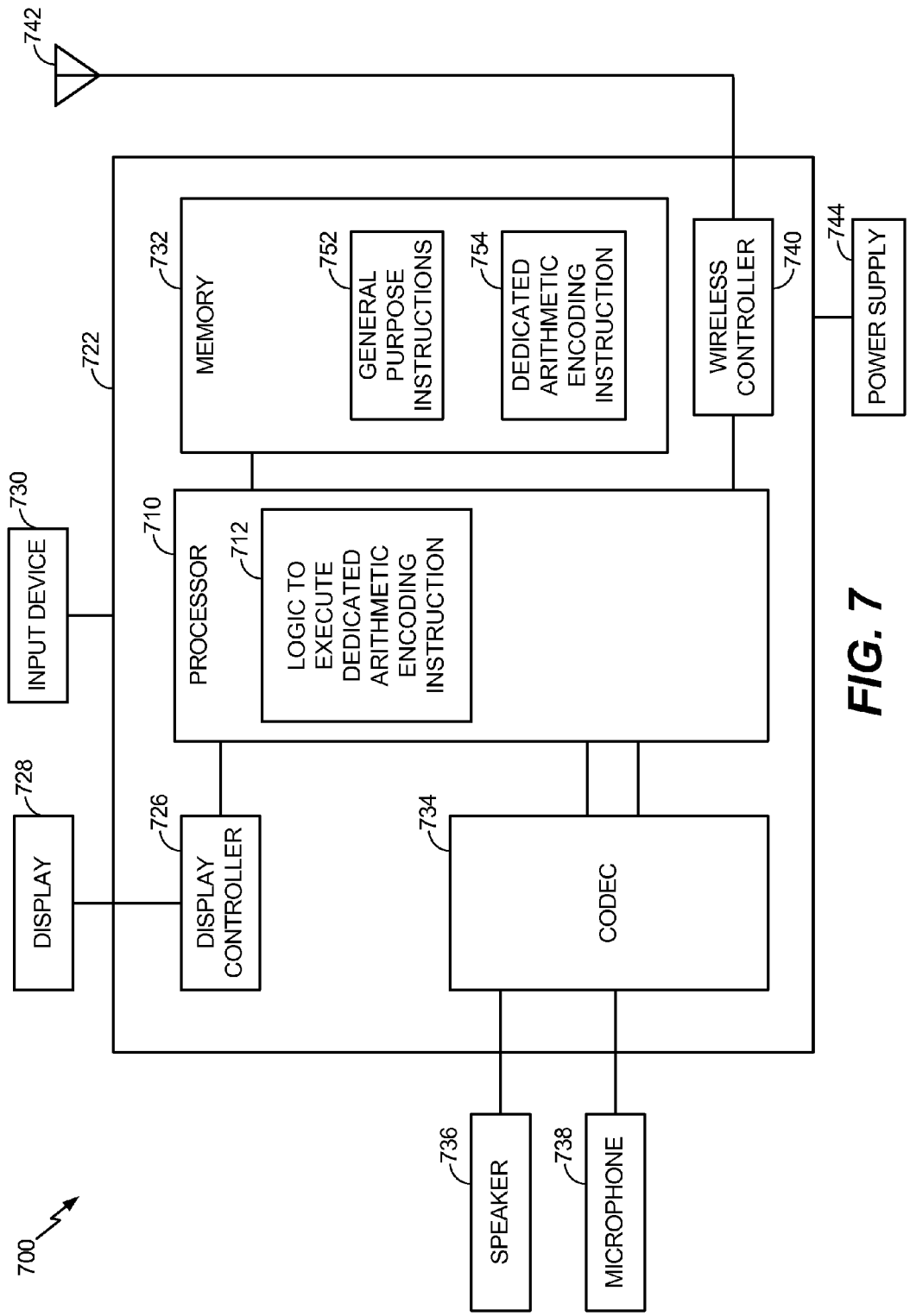
FIG. 7 is a block diagram of a wireless device that includes an instruction set having general purpose instructions and a dedicated arithmetic encoding instruction.

FIG. 7 is a block diagram of a wireless device 700. A memory 732 within the wireless device 700 includes general purpose instructions 752 and a dedicated arithmetic encoding instruction 754. The wireless device 700 includes a processor 710, such as a digital signal processor, coupled to the memory 732. In an illustrative aspect, the processor 710 may include the processor 110 of FIG. 1, and the memory 732 may include the memory 120 of FIG. 1. The memory 732 may be a computer-readable storage medium.

In a particular aspect, the general purpose instructions 752 and the dedicated arithmetic encoding instruction 754 are used in an encoding application or some other encoding software that is stored at the memory 732. For example, the general purpose instructions 752 and the dedicated arithmetic encoding instruction 754 may be used in a CABAC encoding application that is used to encode video. The wireless device 700 also includes logic 712 to execute the dedicated arithmetic encoding instruction 754. In an illustrative aspect, the logic 712 includes the logic 400 of FIG. 4. In a particular aspect, the logic 712 is an execution unit of the processor 710 that is configured to execute general purpose instructions 752 and the dedicated arithmetic encoding instruction 754.

In a particular aspect, the dedicated arithmetic encoding instruction 754 is a single instruction. In a particular aspect, the general purpose instructions 752 and the dedicated arithmetic encoding instruction 754 enable the wireless device 700 to encode an H.264-compliant CABAC-encoded video stream or an H.265-compliant CABAC-encoded video stream. The logic 712 is employed by the processor 710 to execute the dedicated arithmetic encoding instruction 754. In a particular aspect, executing the dedicated arithmetic encoding instruction 754 includes retrieving, processing, and storing data as described herein with respect to FIG. 4.

FIG. 7 also shows an optional display controller 726 that is coupled to the processor 710 and to a display 728. A coder/decoder (CODEC) 734 can also be coupled to the digital signal processor 710. A speaker 736 and a microphone 738 can be coupled to the CODEC 734. FIG. 7 also indicates that a wireless controller 740 can be coupled to the processor 710 and to an antenna 742. In a particular aspect, the processor 710, the display controller 726, the memory 732, the CODEC 734, and the wireless controller 740 are included in a system-in-package or system-on-chip device 722. In a particular aspect, an input device 730 and a power supply 744 are coupled to the system-on-chip device 722. Moreover, in a particular aspect, as illustrated in FIG. 7, the display 728, the input device 730, the speaker 736, the microphone 738, the antenna 742, and the power supply 744 are external to the system-on-chip device 722. However, each can be coupled to a component of the system-on-chip device 722, such as via an interface or a controller. In an illustrative aspect, the wireless device 700 is a cellular telephone, a smartphone, or a personal digital assistant (PDA). Thus, the wireless device 700 may encode a video stream and transmit the encoded video stream via the antenna 742. The video stream may be encoded using the general purpose instructions 752 and one or more of the dedicated arithmetic encoding instructions 754 executed by the logic 712 of the processor 710.

It should be noted that although FIG. 7 depicts the wireless device 700, the logic 712, the general purpose instructions 752, and the dedicated arithmetic encoding instruction 754 may alternatively be included in other devices, such as a set-top box, a music player, a video player, an entertainment unit, a navigation device, a communications device, a fixed location data unit, or a computer.

In conjunction with the described aspects, an apparatus is disclosed that includes means for storing general purpose instructions and a dedicated arithmetic encoding instruction. For example, the means for storing may include the memory 120 of FIG. 1, the memory 732 of FIG. 7, one or more other devices, circuits, or modules to store general purpose instructions and a dedicated arithmetic encoding instruction, or any combination thereof.

The apparatus may also include means for executing the general purpose instructions and the dedicated arithmetic encoding instruction. For example, the means for executing may include the processor 110 of FIG. 1, the general purpose instruction execution logic 112 of FIG. 1, the dedicated arithmetic encoding instruction execution logic 114 of FIG. 1, the predicate register 340 of FIG. 3, the first input register pair 310 of FIG. 3, the second input register pair 320 of FIG. 3, the output register pair 330 of FIG. 3, the logic 400 of FIG. 4, the processor 710 of FIG. 7, the logic 712 to execute dedicated arithmetic encoding instructions 754 of FIG. 7, one or more other devices, circuits, or modules to execute the general purpose instructions and the dedicated arithmetic encoding instruction, or any combination thereof.

Those of skill would further appreciate that the various illustrative logical blocks, configurations, modules, circuits, and algorithm steps described in connection with the aspects disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. An apparatus comprising:
a memory;
a predicate register configured to store a predicate bit value;
a processor coupled to the memory, the processor configured to:
execute a dedicated arithmetic encoding instruction, wherein the dedicated arithmetic encoding instruction is configured to accept a plurality of inputs that include a first range, a first offset, and a first state and to produce one or more outputs based on the plurality of inputs, and wherein a value of at least one output of the one or more outputs is determined based on the predicate bit value; and
based on the one or more outputs of the dedicated arithmetic encoding instruction:
store a second state;
realign the first range to produce a second range; and
realign the first offset to produce a second offset; and
a comparator configured to determine a first comparator output value based on a comparison between a first comparator input value and a second comparator input value, wherein the first comparator input value is based on a context adaptive binary arithmetic coding (CABAC) most probable symbol (MPS) bit stored at a first input register pair, and wherein the second comparator input value is based on the predicated bit value.

2. The apparatus of claim 1, wherein the dedicated arithmetic encoding instruction is executable by the processor to encode a video stream using an entropy coding scheme, and wherein the entropy coding scheme is CABAC.

3. The apparatus of claim 2, wherein the first state includes CABAC state bits, wherein the first range includes CABAC range bits, wherein the first offset includes CABAC offset bits, wherein the plurality of inputs further include a CABAC MPS bit, CABAC bit position (bitpos) bits, and a predicate input value bit, and further comprising a first input register pair and a second input register pair, wherein the processor is further configured to:
retrieve CABAC state bits and the CABAC MPS bit from a first register of the first input register pair;
retrieve the CABAC bitpos bits from a second register of the first input register pair;
retrieve the CABAC range bits from a third register of the second input register pair;
retrieve the CABAC offset bits from a fourth register of the second input register pair;
and
retrieve the predicated bit value from the predicate register.

4. The apparatus of claim 2, wherein the second state includes CABAC state bits, wherein the second range includes CABAC range bits, wherein the second offset includes CABAC offset bits, wherein the dedicated arithmetic encoding instruction generates a CABAC MPS bit, and further comprising an output register pair, wherein the processor is further configured to:
 store the CABAC state bits, the CABAC MPS bit, and the CABAC range bits in a first register of the output register pair; and
 store the CABAC offset bits in a normalized fashion in a second register of the output register pair.

5. The apparatus of claim 1, wherein the dedicated arithmetic encoding instruction is compliant with an H.264 video compression standard or an H.265 video compression standard.

6. The apparatus of claim 1, wherein the dedicated arithmetic encoding instruction is executable by the processor without separating the dedicated arithmetic encoding instruction into one or more general purpose instructions, and wherein logic configured to execute the one or more general purpose instructions and logic configured to execute the dedicated arithmetic encoding instruction correspond to a common execution unit of the processor.

7. The apparatus of claim 1, wherein the dedicated arithmetic encoding instruction comprises a single instruction of an instruction set of the processor, and wherein the processor comprises a pipelined multi-threaded very long instruction word (VLIW) processor.

8. The apparatus of claim 1, further comprising:
 a first input register pair configured to store the first state, a CABAC MPS bit, CABAC bit position (bitpos) bits, or a combination thereof; and
 a second input register pair configured to store the first range, the first offset, or a combination thereof, wherein the first state includes CABAC state bits, the first range includes CABAC range bits, and the first offset includes CABAC offset bits.

9. The apparatus of claim 8, further comprising an inverter configured to:
 receive an inverter input value, the inverter input value based on CABAC state bits of the first input register pair; and
 generate a first inverter output value based on the inverter input value.

10. The apparatus of claim 8, further comprising:
 a logic gate configured to:
  receive a first comparator output value from a comparator, the first comparator output value based on the predicate bit value;
  receive a first inverter output value from an inverter, the first inverter output value based on the first state; and
  determine a logic gate output value based on the first comparator output value and the first inverter output value; and
 a multiplexer coupled to the logic gate, the multiplexer configured to receive the logic gate output value.

11. The apparatus of claim 8, further comprising a multiplexer configured to:
 receive a first input value, a second input value, and a selection signal value, the selection signal value based on the predicate bit value; and
 output a multiplexer output based on the selection signal value, wherein the multiplexer output comprises the output of the first input value, the second input value, or a sum of the first input value and the second input value.

12. The apparatus of claim 1, wherein the comparator is further configured to:
 receive the first comparator input value, the first comparator input value based on the CABAC MPS bit stored at the first input register pair; and
 receive the second comparator input value.

13. The apparatus of claim 1, wherein the first comparator output value comprises a first logical value when the predicated bit value is equal to the first comparator input value or a second logical value when the second comparator input value is different from the first comparator input value.

14. The apparatus of claim 1, further comprising a logic gate configured to determine a logic gate output value based on the first comparator output value and a first inverter output value, wherein the first comparator output value is based on the comparison between the first comparator input value and the second comparator input value, and wherein the first inverter output value is based on the first state.

15. The apparatus of claim 1, further comprising a logic gate configured to:
 receive the first comparator output value from a comparator;
 receive a first inverter output value from an inverter, the first inverter output value based on the first state; and
 determine a logic gate output value based on the first comparator output value and the first inverter output value.

16. The apparatus of claim 1, wherein the memory, the processor and the comparator are integrated into a mobile communications device.

17. A method comprising:
 storing a predicate bit value at a predicate register;
 executing, at a processor, a dedicated arithmetic encoding instruction, wherein the dedicated arithmetic encoding instruction accepts a plurality of inputs including a first range, a first offset, and a first state and produces one or more outputs based on the plurality of inputs, and wherein a value of at least one output of the one or more outputs is determined based on the predicate bit value;
 performing renormalization on the first range and the first offset to generate one or more values of the first range that are greater than or equal to a threshold; and
 based on the one or more outputs of the dedicated arithmetic encoding instruction, storing a second state, realigning the renormalized first range to produce a second range, and realigning the renormalized first offset to produce a second offset.

18. The method of claim 17, wherein executing the dedicated arithmetic encoding instruction comprises:
 providing the first range to a shifter; and
 using the first state as an index look-up value for a context adaptive binary arithmetic (CABAC) lookup table, wherein the CABAC lookup table is hard-coded or rewriteable.

19. The method of claim 17, further comprising:
 performing renormalization on the second offset independent of a carrier bit of the second offset;
 in response to performing renormalization, inputting multiple bytes of the second offset into a bitstream; and
 transmitting the bitstream to a decoder.

20. The method of claim 17, wherein the first offset corresponds to a set of bits in a first register of an output register pair, wherein performing renormalization comprises determining whether the first range is less than or equal to a first value, and wherein performing renormalization further comprises in response to a determination that the first range is less than or equal to the first value, determining whether a byte stored in a portion of the first register is greater than or equal to a second value.

21. A non-transitory computer-readable medium comprising a dedicated context adaptive binary arithmetic (CABAC) encoding instruction that accepts a plurality of inputs including a first range, a first offset, a first state, and a predicate bit value stored at a predicate register and produces one or more outputs based on the plurality of inputs, wherein a value of at least one output of the one or more outputs is determined based on the predicate bit value, and wherein when the dedicated CABAC encoding instruction is executed by a processor, the dedicated CABAC encoding instruction causes the processor to:
  perform renormalization on the first range and the first offset to generate one or more values of the first range that are greater than or equal to a threshold;
  store a second state;
  realign the renormalized first range to produce a second range; and
  realign the renormalized first offset to produce a second offset.

22. The non-transitory computer-readable medium of claim 21, wherein the dedicated CABAC encoding instruction is executable by the processor to:
  encode a video stream; and
  perform renormalization on the second offset independent of a carrier bit of the second offset.

23. An apparatus comprising:
  means for storing general purpose instructions and a dedicated arithmetic encoding instruction;
  means for storing a predicate bit value at a predicate register;
  means for executing the general purpose instructions retrieved from the means for storing the general purpose instructions;
  means for executing the dedicated arithmetic encoding instruction retrieved from the means for storing the general purpose instructions; and
  means for determining a first comparator output value based on a means for comparing between a first comparator input value and a second comparator input value, wherein the first comparator input value is based on a context adaptive binary arithmetic coding (CABAC) most probable symbol (MPS) bit stored at a first input register pair, and wherein the second comparator input value is based on the predicate bit value,
  wherein the dedicated arithmetic encoding instruction accepts a plurality of inputs including a first range, a first offset, and a first state, wherein the dedicated arithmetic encoding instruction is executable to produce one or more outputs based on the plurality of inputs, wherein a value of at least one output of the one or more outputs is determined by the means for executing based on the predicate bit value, and
  wherein a second state is stored, the first range is realigned to produce a second range, and the first offset is realigned to produce a second offset based on the one or more outputs.

* * * * *